United States Patent [19]

Gordon

[11] Patent Number: 4,731,239

[45] Date of Patent: Mar. 15, 1988

[54] METHOD FOR ENHANCING NMR IMAGING; AND DIAGNOSTIC USE

[76] Inventor: Robert T. Gordon, 4936 W. Estes, Skokie, Ill. 60076

[21] Appl. No.: 916,350

[22] Filed: Oct. 7, 1986

Related U.S. Application Data

[63] Continuation of Ser. No. 816,695, Jan. 6, 1986, abandoned, which is a continuation of Ser. No. 460,889, Jan. 25, 1983, abandoned, which is a continuation-in-part of Ser. No. 456,555, Jan. 10, 1983, abandoned.

[51] Int. Cl.$^4$ .................. A61K 49/00; A61B 6/00; A61B 5/05
[52] U.S. Cl. ........................... 424/9; 128/653; 128/654; 436/173; 436/526; 436/806
[58] Field of Search ............... 424/9; 128/653, 654; 436/518, 173, 806, 526

[56] References Cited

U.S. PATENT DOCUMENTS

| | | | |
|---|---|---|---|
| 3,474,777 | 10/1969 | Figge et al. | 128/1.1 |
| 3,592,185 | 7/1971 | Frei | 128/2 |
| 3,681,245 | 8/1972 | Lee | 252/62.55 |
| 3,700,555 | 10/1972 | Widmark et al. | 435/2 |
| 3,832,457 | 8/1974 | Sugimoto et al. | 424/4 |
| 3,917,538 | 11/1975 | Rosenweig | 252/62.51 |
| 3,922,687 | 11/1975 | Trimble et al. | 346/74.1 |
| 4,001,288 | 1/1977 | Gable et al. | 260/439 R |
| 4,018,886 | 4/1977 | Giaever | 424/12 |
| 4,047,814 | 9/1977 | Westcott | 356/38 |
| 4,101,435 | 7/1978 | Hasegawa | 252/62.53 |
| 4,106,488 | 8/1978 | Gordon | 128/1 R |
| 4,136,683 | 1/1979 | Gordon | 128/2 H |
| 4,187,170 | 2/1980 | Westcoh et al. | 209/1 |
| 4,255,492 | 3/1981 | Audran et al. | 428/694 |
| 4,269,826 | 5/1981 | Zimmermann et al. | 424/101 |
| 4,323,056 | 4/1982 | Borrelli et al. | 128/1.3 |
| 4,335,094 | 6/1982 | Mosbach | 424/9 |
| 4,345,588 | 8/1982 | Widder et al. | 128/1.3 |
| 4,359,453 | 11/1982 | Gordon | 424/9 |
| 4,360,441 | 11/1982 | Borrelli et al. | 252/62.59 |
| 4,364,377 | 12/1982 | Smith | 128/1.5 |
| 4,392,040 | 7/1983 | Rand et al. | 219/10.71 |
| 4,452,773 | 6/1984 | Molday | 424/1.1 |
| 4,454,106 | 6/1984 | Gansow et al. | 424/1.1 |
| 4,508,625 | 4/1985 | Graham | 210/695 |
| 4,615,879 | 10/1986 | Runge et al. | 424/9 |
| 4,647,447 | 3/1987 | Gries et al. | 424/4 |

FOREIGN PATENT DOCUMENTS

| | | |
|---|---|---|
| 0135125 | 3/1985 | European Pat. Off. |
| WO83/03920 | 11/1983 | PCT Int'l Appl. |
| WO84/02643 | 7/1984 | PCT Int'l Appl. |
| WO85/04330 | 10/1985 | PCT Int'l Appl. |
| WO86/6112 | 2/1986 | PCT Int'l Appl. |

OTHER PUBLICATIONS

Horrocks, Jr. et al., "Lanthanide Porphyrin Complexes", Journ. of the Am. Chem. Soc., 198:231, 11/10/76.
Fabs letters, vol. 168, No. 1, Mar. 1984, pp. 70-74.
Kaiser, Robert, IEEE Transactions on Magnetics, vol. 6, No. 3, Sep. 1970, pp. 694-698.
Runge et al., Int. J. Nucl. Med. Biol., vol. 12, No. 1, pp. 37-42, 1985.
New Scientist, 15 Mar. 1979, pp. 874-877.
Journal of Pharmaceutical Sciences, vol. 68, No. 1, Jan. 79, pp. 79-81, Widder et al.
Chem. Abstract, vol. 99, 1983, p. 232-CA:49837.
Newbower, Ronald, IEEE Transactions on Magnetics, vol. Mag. 9, No. 3, Sep. 1973, pp. 447-450.

*Primary Examiner*—Sidney Marantz
*Assistant Examiner*—Stephen C. Wieder
*Attorney, Agent, or Firm*—Millen & White

[57] ABSTRACT

An improvement in NMR imaging techniques is disclosed, whereby the image is "shadowed" to intensify and contrast the image generated by the NMR sensitive nuclei, as a consequence of the introduction to the examined locus, e.g., human tissue of ferromagnetic, diamagnetic or paramagnetic particles. The intensified and clarified image is itself diagnostically valuable, in accordance with art recognized methods but also provides an improved information base for establishing and controlling treatment modes, especially in determining spatial density and distribution of particles by comparing standard and enhanced images. According to a preferred embodiment, metabolizable particles are employed, whereby the change and rate of change with metabolic time can be imaged, compared, and correlated with various metabolic diseases or malignant states.

18 Claims, No Drawings

METHOD FOR ENHANCING NMR IMAGING; AND DIAGNOSTIC USE

This is a continuation of application Ser. No. 816,695, filed Jan. 6, 1986 which is a cont. of 460,889, filed Jan. 25, 1983, which is a CIP of 456,555, filed Jan. 10, 1983, all now abandoned.

FIELD OF THE INVENTION

This invention relates to medical imaging and more particularly to a method for enhancing nuclear magnetic resonance imaging.

BACKGROUND OF THE INVENTION

Although it had been known since the 1920's that many atomic nuclei have angular momentum arising from their inherent property of rotation, or spin and that each nucleus of nonzero spin has a magnetic moment or dipole associated with it, it wasn't until 1948 that the first nuclear magnetic resonance method was developed as a tool applied to studies of structural chemistry and it was not until the late 1970's that the method found application in clinical diagnosis.

Nuclear magnetic resonance imaging is based on the manipulation of an entire population of nuclei by the exposure of the nuclei to an external magnetic field, altering the characteristics of said field and measuring the response of the nuclei thereto.

The magnetic behavior of the entire population of nuclei can be defined by the macroscopic or bulk magnetization vector, which represents the net effect of all of the magnetic moments of all of the nuclei of a given species in the sample being analyzed. In the absence of an external magnetic field, the magnetic dipoles will be pointing in random directions hence the bulk magnetization will be zero. However, when the population of nuclei is exposed to an external magnetic field the dipoles become oriented, pointing in a direction parallel to the applied field.

Once the external magnetic field has been applied and the bulk magnetic moment of the population has been established, the next phase of the analysis involves perturbing the oriented nuclei. The perturbation is accomplished by the application of a second magnetic field at right angles to the first and alternating in polarity. The analogy of a spinning top or gyroscope has been applied to illustrate the effect of this second magnetic field. The spinning nuclei are represented as spinning tops or gyroscopes and because of the influence of the initial magnetic field all of the axes of the gyroscopes are pointed vertically. If the axis of a spinning gyroscope is tipped away from the vertical, the gyroscope will continue to rotate about the former vertical axis in a motion describing the wall of an inverted cone. This motion is known as precession. Similarly, the bulk magnetization vector can be caused to precess about its original axis under the "tipping" influence of a second magnetic field. It should be understood that in order to tip the macroscopic spin vector away from its original axis, the applied electromagnetic radiation must match (i.e. be in resonance with) the natural precessional frequency of the nuclei of the sample, hence the term nuclear magnetic resonance (NMR).

A simple mathematical relation links the resonance frequency, often called the Larmor frequency, to the value of the externally applied static magnetic field. The frequency is equal to the strength of the field multiplied by the "gyromagnetic ratio," which is unique for each nuclear species of nonzero spin. For hydrogen nuclei (protons) in a magnetic field of one tesla (10,000 gauss) the resonance frequency is 42.57 megahertz (MHz), or 42.57 million cycles per second. For nuclei of the isotope phosphorus 31($^{31}$P) in the same field the resonance frequency is 17.24 MHz; for nuclei of sodium 23($^{23}$Na) it is 11.26 MHz. These frequencies are far below those of X-rays or even visible light and as such are powerless to disrupt the molecules of living systems, hence providing one of the major desirable features of this type of analysis when applied to diagnostic scanning.

During the perturbation caused by the application of the second field many of the nuclei which are in a low energy state (i.e. their magnetic moments are aligned with the first (static) magnetic field) undergo a transition to a higher energy state (i.e. their magnetic moments tend to be aligned with the second (rotating or alternating) field. The displacement angle between the nuclear magnetization vector and the direction of the static magnetic field continues to increase as long as the competing rotating field is applied and the rate of increase depends on the power of the field. A pulse long and strong enough to tip the bulk vector from its original position to one which is parallel to the rotating field is known as a 90° pulse owing to the perpendicular arrangement of the two magnetic fields. Precession pattern of nuclei under these conditions resemble a flattened disc rather than a cone.

Once the external energy source of alternating frequency is removed, the nuclei in the excited (high energy) state tend to revert to the more stable (low energy) state. This is accomplished by a remission of the energy at the same frequency (Larmor frequency) at which it was absorbed. It is the detection and analysis of this decay signal which forms the basis of the NMR imaging technology.

The return to equilibrium of the nuclei is characterized by two principal "relaxation times", $T_1$ and $T_2$. The relaxation times $T_1$ (spin-lattice or longitudinal relaxation time) and $T_2$ (spin-spin or transverse relaxation time) are parameters which describe the exponential return to equilibrium of the nuclear magnetism of the sample nuclei in directions parallel or perpendicular, respectively, to the applied (i.e. rotating) magnetic field. The rate at which nuclei assume the ground state depends on how readily they can dispose of their excess energy. $T_1$ represents a time constant describing one route for the dissipation of said energy, specifically the loss of energy to the local molecular environment (i.e. the lattice). $T_2$, on the other hand, is a rate constant which describes a second route of dissipation, namely the loss of energy to other protons. This latter disposition of energy has the effect of dephasing many of the excited nuclei without loss of energy to the surrounding environment.

A variety of methods exist for converting the NMR resulting from free induction decay into an image. Damadian (Philos. Trans. R. soc. Lond. Biol. 289:111–121 (1980)) has taken the approach of displaying the intensity of the NMR signal from discrete points in the human anatomy on a coordinate grid. This method depends on the shape of the magnetic field produced by the particular magnet configuration employed to focus on a given point within the body. The magnetic field used has been described as "saddle shaped", and its strength is said to vary appreciably within very small distances along the sloping surface of this configuration. The field center (or "saddle point") is used as the reference to choose an exciting RF frequency to achieve the resonance condition. Using this technique, an image is created by moving the body area to be examined through the saddle point in an ordered fashion so that a recognizable structure will be achieved from the signal determinations at each location of interest.

Lauterbur and Lai (I.E.E.E. Trans. Nucl. Sci. 27:1227-31 (1980)) have described a method of image reconstruction involving the analysis of many planes of NMR signals in a manner similar to X-ray computed tomographic (CT) images. In this technique, known as zeugmatography, signals from the sample volume are contained in each one-dimensional projection. Imaging may be achieved by superimposing a linear magnetic field gradient on the area of interest (e.g., human anatomic area or organ) that has been placed in a uniform magnetic field. The resonance frequencies of the precessing nuclei will depend on their position along the direction of the magnetic gradient. If one obtains a series of one-dimensional projections at different gradient orientations, two- and three-dimensional images of the structure or organ of interest can be obtained by this technique.

Other techniques may isolate a point, line, or plane within the human body by use of oscillating magnetic field gradients, as for example described by Hinshaw et al. (Br. J. Radiol. 51:273-280 (1978)).

Although a potentially useful system, NMR imaging is plagued with several problems. Firstly, NMR is much less sensitive than other forms of spectroscopy and secondly, its use is restricted to certain atomic nuclei. Three nuclei have been used almost exclusively in biological NMR imaging studies, the hydrogen atom or proton ($^1H$), $^{31}$phosphorus ($^{31}P$), and $^{13}$carbon ($^{13}C$). Of the three the proton gives the strongest signal but is so ubiquitous in living tissue that special techniques are necessary to resolve individual signals from a multitude of overlapping peaks. The most abundant isotope of carbon is $^{12}C$, which possesses no nuclear spin. Only 1% of natural carbon is $^{13}C$ which yields a much weaker signal than the proton. Most NMR work on intact biological systems has centered on $^{31}P$, the naturally occurring isotope of phosphorus, but this nucleus only gives a signal one-sixth the strength of the proton.

Several attempts have been made to try to overcome the low sensitivity of NMR. For example a system whereby many spectra are summed (overlayed) has been employed. For biological work, the procedure is best carried out with pulsed NMR, in which short, powerful bursts of radiation at many frequencies are given to the sample. Each resultant signal contains all the information required to generate an entire spectrum by the mathematical process of Fourier transformation but in practice it is usual to add together many signals before transforming them in order to obtain a sufficient signal/noise ratio.

One further aspect of NMR spectroscopy must be mentioned: the time taken for the nuclei perturbed by the radiofrequency signal to relax back to their unperturbed state. This obviously limits the rate at which pulses can usefully be administered to the sample.

Investigations by Brady, T. J. et al. (Radiology 143:343-347 (1982)) and Ujeno, Y. (Physiol. Chem. & Physics 12:271-275 (1980)) have sought to enhance proton signals by the addition of substances which affect the $T_1$ and $T_2$ relaxation times of the NMR-sensitive nuclei. As will be apparent from the discussion to follow, one object of the instant invention is to enhance NMR-imaging, not by affecting $T_1/T_2$ per se, but rather to focus and concentrate the magnetic field which is applied to the sample, so that the sharpness of the signal is augmented (i.e., less dispersion in the peaks) whereby the resolution or clarity of the mapped signals, i.e., the image is enhanced.

BRIEF DESCRIPTION OF THE INVENTION

This invention relates to the area of nuclear magnetic resonance imaging enhancement. The subject invention relates to a method of enhancing NMR imaging by the introduction of ferromagnetic, diamagnetic or paramagnetic particles which act to focus and concentrate the magnetic field in the area to be imaged, thereby improving image intensity due to NMR-sensitive nuclei within the sample area. Further, by comparing the images before and after addition of the particles, the changes therein can be related to the spatial density and distribution of the particles themselves.

The increased resolution and sensitivity resulting from the application of the instant invention will permit, not only structural evaluations, but metabolic monitoring as well.

The latter is particularly true if the ferromagnetic, diamagnetic, a paramagnetic particles are themselves subject to metabolism by the cells of the sample to be analyzed. The particles then serve as sensitive metabolic "probes" of the extracellular and/or intracellular environment of the cells within the area to be imaged.

DETAILED DESCRIPTION OF THE INVENTION

This invention relates to the area of medical imaging and more specifically to the enhancement of nuclear magnetic resonance imaging. Although the subject invention may be employed with any of many imaging systems currently available, a zeugmatography system will be used for ease of discussion.

The conceptual problem which plagued all early attempts at NMR imaging was the manner in which the relatively uniform NMR signal emanating from the sample would be encoded with spatial information. The breakthrough occurred with the appreciation that the signal was not completely uniform, that is to say the NMR could be distorted according to the shape and size of the sample. The distortion is due to nonuniformities in the static magnetic field. This particular feature, long considered to be an imperfection to be removed by NMR spectroscopists, was to be fostered by scientists concerned with the imaging problem. Since the degree of distortion depends on how much of the sample was located in nonuniform parts of the field and on the magnitude of the distortion, it was necessary for imaging to be successful to deliberately make the field nonuniform. The controlled nonuniformity is achieved by superimposing upon the static magnetic field a linear magnetic field gradient.

The first images produced by Lauterbur borrowed image-reconstruction computer algorithms, used in computerized tomography scanning. If a sample of water is placed in a homogeneous magnetic field, the NMR frequency spectrum of the hydrogen nuclei in the water molecules is a single narrow line. If the magnetic field is perfectly uniform, the shape of the line is independent of the geometry of the sample. If a linear magnetic field gradient is now superimposed, resonant nuclei at one side of the sample will feel a weaker total magnetic field than those at the other side. There will thus be a linear distribution of Larmor frequencies across the sample. Then the free induction decay signal can be subjected to Fourier transformation, a mathematical procedure that transforms the data from a curve representing signal strength v. time into one representing signal strength v. frequency.

The result is a spectrum that is broadened to a shape corresponding to the one-dimensional projecting of the strength of the NMR signal onto the frequency axis. By rotating the magnetic field gradient electronically one can secure a projection from a slightly different angle. Computer analysis of many such projections reconstructs the sample's geometry. In the two-dimensional application of the technique the direction of the gradient is rotated within a single plane. In the three-dimensional extension of the method the gradient is rotated in three-dimensional space through at least half a sphere.

This method of imaging, as well as the others mentioned previously, is not without some negative aspects. Chiefly, among them is a loss of resolution. Spatial resolution of an NMR image is dictated by the uniformity of the static field and by the strength of the field gradients. Thus the modification of the uniformity of the static field which permits spatial analysis of structures, limits the resolution of those very structures. It is the object of the instant invention to increase the resolution of NMR images by the use of accessory materials to focus and concentrate the magnetic fields applied to the sample to be imaged.

Accessory materials particular useful in the light of the subject invention are those described by Gordon in U.S. Pat. Nos. 4,303,636 and 4,136,683. Although tne particles so described do not contain NMR-sensitive nuclei (i.e. an odd number of protons or neutrons) they do possess unpaired electrons and hence display a magnetic moment. The particles will thus influence the magnetic fields of an NMR system and therefore, the images resulting from the signals generated by nuclei which are NMR-sensitive will be enhanced. (The obverse is also true, whereby the intensification of extant NMR sensitive nuclei is used as an indicator of the spatial density and distribution of the particles. This application is particular useful when the enhancing particles are to be used ultimately in a treatment regimen as described by Gordon in U.S. Pat. No. 4,106,488.) More specifically, these fine particles, responsive to and interactive with the imposed magnetic field (provide more local anomalies) in the field and enhance the mapped signal image in much the manner of the enhancement or a television image by increasing the number of "lines" transmitted and displayed. Less dispersion is seen in individual peaks, i.e., they are sharper whereby the image is better resolved, offering enhanced clarity. The particles serve a "shadowing" function, intensifying and contrasting an image generated by the NMR sensitive nuclei. More specifically the particles affect particularly spin-spin interactions related to the dephasing of nuclei and the transfer of energy between adjacent nuclei, hence $T_2$ values are influenced by the presence of the particles. That is, the presence of a substance having a certain magnetic susceptibility in a high frequency oscillating field causes a change in frequency as a consequence of a "heterodyning" phenomenon relative to a fixed frequency signal. Each magnetically susceptible nucleus when dephased acts as a high frequency oscillator; and the presence of the ferromagnetic, diamagnetic or paramagnetic particles thus dampens or reinforces the phased precession of the magnetically susceptible nuclei, affecting the observed frequencies directly and therefore sharpening the resultant NMR peaks reflected in individual plots of signal vs frequency, or mapped sample regions collecting such peaks. The result is a clearer image, of enhanced resolution, by reason of the controlled perturbation of the field in a frequency related manner, in turn governing the width of the plotted NMR peaks. In contradistinction to the above effect, the use of paramagnetic salts or radio protective substances as disclosed by Brady, et al. or Ujeno supra merely influences diffusional Brownian motion, providing an "ordering" to the system (i.e., lattice) reflected primarily in changes in spin-lattice relaxation times, or $T_1$.

As aforesaid, the particles employed are those generically disclosed in Gordon U.S. Pat. Nos. 4,303,636 and 4,136,683. These fine particles, unlike macro-particulate materials intended merely to modify $T_1$, $T_2$, by reason of their size (and shape), provide a multiplicity of anomalies to the magnetic field in a localized area. Where the particles are selectively absorbed or collected through bioprocesses, the particle spatial distribution or density itself further enhances resolution of the images in the localized region of interest. Then, the pattern of distribution itself evidences the underlying bioprocess as for example malignancy requiring treatment such as that of Gordon U.S. Pat. No. 4,106,488.

The particles may be supplied to the system, e.g., tissue, organ or organism in a selective manner to provide intracellular absorption or more generally, are selected to have a fine particle size sufficient to enhance the NMR image. Generally, the particles lie in the micron range, and preferably are of no more than 1 micron in dimension. Shape selection may be of importance in a given system, and will be chosen in relation to use and performance.

According to one form of the invention metabolically susceptible ferromagnetic, diamagnetic, or paramagnetic particles may be employed. Particularly useful materials in this regard include iron dextrans, metal-containing hematoporphyrins, such as rare-earth metal-containing porphyrins and the like.

Although attempts to measure cellular metabolism by means of NMR have been made (Roberts and Jardetzky, Biochem. Biophys. Acta. 639:53–76 (1981)), they have been hampered by low sensitivity thus limiting in vivo observations to largely low molecular weight metabolites that are present in relatively high concentration.

The application of the instant application removes such limitations. By providing an image-enhancing environment any or all of the NMR-sensitive nuclei within the sample area may be examined. Furthermore, since it is the image-enhancing environment that is the target of cellular metabolism, changes in image intensity and or sensitivity will result even if the NMR sensitive nuclei which generate the image are metabolically inert.

When the sample area to be monitored is "perfused" with a known metabolically reactive image-enhancing particle, a general picture of the metabolic state of the sample area will emerge. Alternatively, a specific location with the sample area may be examined by employing metabolically susceptible image enhancing particles which will specifically localize in the area of interest. This specific targeting may be achieved by judicious selection of the metabolically suscepcible particles. For example, selection based upon particle size, charge and composition can be used to ensure intracellular localization or, if desired, cellular exclusion of the particle. Specific cell types or cellular locations may be monitored by specifically targeting the particles by means of antigens, antibodies, enzymes or specific prosthetic groups. In the latter case, porphyrins containing ferromagnetic, diamagnetic or paramagnetic particles are employed, for example, to ensure localization within specific intracellular compartments such as mitochondria or chloroplasts.

If intracellular localization is desired, the particles may be constructed and delivered to the same area as described by Gordon in U.S. Pat. Nos. 4,303,636; 4,136,683, or 4,106,488 incorporated herein by reference. In accordance with preferred embodiments, a metabolizable form of particle is employed. Particularly useful material for such a formulation is an iron dextran as described by Cox et al. (J. Pharmacy and Pharacol 24(7):513-17 (1971)). The image-enhancing particles thus become sensitive probes of the metabolic environment and are therefore useful for the diagnosis of various metabolic diseases as well as malignancies. All that is necessary for such a determination to be made is to image a sample area containing the metabolically susceptible image enhancing particles, wait for a sufficient period of metabolic time, e.g. that amount of time required for a significant, measurable change to occur in the magnetic properties of the susceptible particles due to the action of cellular metabolism, then reimage the area of interest. A comparison of the images resolvable at the beginning and the end of said time span is then correlated with various metabolic disease or malignant states.

What is claimed is:

1. A method for nuclear magnetic resonance (NMR) imaging of a patient comprising, prior to the NMR imaging of a patient, administering to said patient ferromagnetic, paramagnetic or diamagnetic particles effective to enhance an NMR image.

2. The method according to claim 1 wherein the particles are ferromagnetic.

3. The method according to claim 1 wherein the particles are paramagnetic.

4. The method according to claim 1 wherein said particles are less than 1 micron in size.

5. The method according to claim 1 wherein said particles are selected from the group consisting of ferric hydroxide and iron oxide.

6. The method according to claim 1 wherein said particles are selectively directed to specific areas by the use of antigens, antibodies, enzymes, or specific prosthetic groups.

7. The method according to claim 1 wherein the resulting enhanced image due to the magnetic-resonant sensitive nuclei provides information about spatial and density distribution of said particles.

8. A method for nuclear magnetic resonance (NMR) imaging of a patient comprising, prior to the NMR imaging of a patient, administering to said patient metabolizable ferromagnetic, paramagnetic or diamagnetic particles effective to enhance an NMR image.

9. The method according to claim 8, wherein said particles are less than 1 micron in size.

10. The method according to claim 8 wherein said metabolizable particles are selected from the group consisting of iron dextrans, hematoporphyrins, metal containing porphyrins, and rare earth metal-containing porphyrins.

11. The method according to claim 8 wherein said particles are selectively directed to specific areas by the use of antigens, antibodies, enzymes, or specific prosthetic groups.

12. The method according to claim 8 wherein the enhanced image intensity is due to the magnetic-resonant sensitive nuclei provides information about spatial and density distribution of said particles.

13. A method for nuclear magnetic resonance (NMR) imaging of a patient comprising, prior to the NMR imaging of a patient, administering to said patient metabolizable ferromagnetic, paramagnetic or diamagnetic particles effective to enhance an NMR image, imaging said patient, and after the passage of a predetermined period of metabolic time, reimaging said patient thereby detecting metabolic changes within said patient.

14. The method according to claim 13 which comprises the further step of correlating said metabolic changes with various metabolic disease and malignant states.

15. The method according to claim 13 wherein said particles are less than 1 micron in size.

16. The method according to claim 13 wherein said metabolizable particles are selected from the group consisting of iron dextrans, hematoporphyris, metal-containing porphyrins, and rare earth metal containing porphyrins.

17. The method according to claim 13 wherein said particles are selectively directed to specific areas by the use of antigens, antibodies, enzymes, or specific prosthetic groups.

18. A method for improving resolution in NMR medical imaging of an area of a patient comprising, administering to an area of a patient a population of particles having a magnetic moment, said population in size and density being sufficient to enhance the clarity of the mapped NMR signals.

* * * * *